United States Patent
Sun et al.

(10) Patent No.: US 9,189,575 B2
(45) Date of Patent: Nov. 17, 2015

(54) SVR DYNAMIC SYSTEM MODELING WITH DELAYED OUTPUT MEASUREMENTS

(71) Applicant: Toyota Motor Engineering & Manufacturing North America, Inc., Erlanger, KY (US)

(72) Inventors: Jing Sun, Superior Township, MI (US); Kenneth R. Butts, Grosse Pointe Woods, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 305 days.

(21) Appl. No.: 13/793,058

(22) Filed: Mar. 11, 2013

(65) Prior Publication Data

US 2014/0257768 A1    Sep. 11, 2014

(51) Int. Cl.
*G06F 7/60* (2006.01)
*G06F 17/10* (2006.01)
*G06F 17/50* (2006.01)

(52) U.S. Cl.
CPC .................... *G06F 17/5009* (2013.01)

(58) Field of Classification Search
CPC .................................................. G06F 17/5009
USPC ............................................................ 703/2
See application file for complete search history.

(56) References Cited

U.S. PATENT DOCUMENTS

| | | | |
|---|---|---|---|
| 5,877,954 A | 3/1999 | Klimasauskas et al. | |
| 6,373,033 B1 | 4/2002 | de Waard et al. | |
| 7,899,652 B2 * | 3/2011 | Lu et al. | 703/2 |

FOREIGN PATENT DOCUMENTS

EP    0907117 A1    4/1999

OTHER PUBLICATIONS

Zhao Lu, Jing Sun, "Non-Mercer hybrid kernel for linear programming support vector regression in nonlinear systems identification" Science Direct, 2008 pp. 94-99.*
Zhao Lu, Jing Sun, Kenneth Butts, "Application of Linear Programming SVM-ARMA2K for Dynamic Engine Modeling" 2010 American Control Conference, pp. 1465-1470.*
U.S. Appl. No. 13/327,925, filed Dec. 16, 2011 with title Asymemetric Wavelet Kernel in Support Vector Learning.

* cited by examiner

*Primary Examiner* — Dwin M Craig
(74) *Attorney, Agent, or Firm* — Dinsmore & Shohl LLP

(57) ABSTRACT

The method comprises the steps of inputting a first set of data into both a physical system and into an SVR model. The method includes collecting a second set of system data from the physical system and stacking a plurality of SVR models to form an output prediction without feeding back the model output. Another aspect of the invention includes a method of hybrid modeling having delayed output measurement. This method includes the steps of inputting a first set of data into both a physical system and into an SVR model and collecting a second set of system data from the physical system. A modeling error is injected into both the second set of system data from the physical system and a third set of system data from the SVR model wherein the modeling error thereby leads to substantially improved model output.

9 Claims, 5 Drawing Sheets

SVR DYNAMIC SYSTEM MODELING WITH DELAYED OUTPUT MEASUREMENTS

FIELD OF THE INVENTION

The present invention relates to nonlinear dynamic systems identification and modeling, in particular using SVR dynamic modeling with delayed output measurements.

BACKGROUND OF THE INVENTION

Models of dynamic systems are of great importance in almost all fields of science and engineering and specifically in control, signal processing, and information science. Most systems encountered in the real world are nonlinear and in many practical applications nonlinear models are required to achieve an adequate modeling accuracy. A model is always only an approximation of a real phenomenon so that having an approximation theory which allows for analysis of model quality is a substantial concern.

A support vector regression (SVR) model was developed for accurate modeling of nonlinear systems. While the SVR capability for representing static nonlinearity has been proven to be powerful in several case studies, its application for nonlinear dynamic system modeling has met several challenges. Particularly, difficulty in implementing the SVR model in parallel configuration for dynamic systems has been identified as one of the key hurdles in this application. Accordingly, there exists a need in the art to provide an SVR model having a parallel or parallel-like configuration for dynamic systems.

The SVR model is optimized and implemented in a series-parallel configuration. FIG. 1A illustrates the series-parallel configuration. The series-parallel configuration takes the measured inputs and outputs to predict the future output of a dynamic system. The model and physical system are running in parallel, but the output of the physical system is fed into the SVR model. For other applications, particularly for cases where outputs are not measured, a model having a parallel configuration, such as shown in FIG. 1B, is required. The parallel model does not rely on output from the physical system to predict the future output. Therefore, it can be run in parallel with the physical system.

While the derivation of the SVR models for the series-parallel implementation can be formulated as a linear programming or quadratic programming optimization problem, the direct optimization of the SVR model for the parallel implementation is computationally prohibitive. Consequently, the derivation of the parallel model is often done as a post-processing step after the series-parallel model as shown in FIG. 1A is derived. It is common for one to derive the series-parallel model using linear programming or quadratic programming and then rewrite the resulting SVR model as shown in FIG. 1A into a parallel implementation as shown in FIG. 1B.

The parallel and series-parallel models are different in structure in that the parallel model requires internal feedback while the series-parallel model does not. The parallel model directly translated from the series-parallel model cannot be guaranteed to have the desired properties, such as stability and model accuracy.

SUMMARY OF THE INVENTION

The present invention provides for a method of forward prediction using stacked SVR models. The method comprises the steps of inputting a first set of data into both a physical system and into an SVR model. The method further comprises the steps of collecting a second set of delayed system data from the physical system and stacking a plurality of SVR models to form a prediction model. The resulting SVR model uses $u(k-1)$ and delayed output $y(k-d)$ to predict $y(k)$ without utilizing feedback loops from the model output thereby yielding improved accuracy compared to the parallel SVR model. Another aspect of the invention includes a method of hybrid modeling having delayed output measurement. This method includes the steps of inputting a first set of data into both a physical system and into an SVR model and collecting a second set of system data from the physical system. A further third set of system data is collected from the SVR model. The SVR model is provided with both the second set of system data from the physical system and the third set of system data from the SVR model. Further, a modeling error calculated by comparing the delayed physical output and delayed model output is injected to form the prediction of the hybrid SVR model thereby leads to substantially improved model output.

DETAILED DESCRIPTION OF THE INVENTION

Figure 1A:
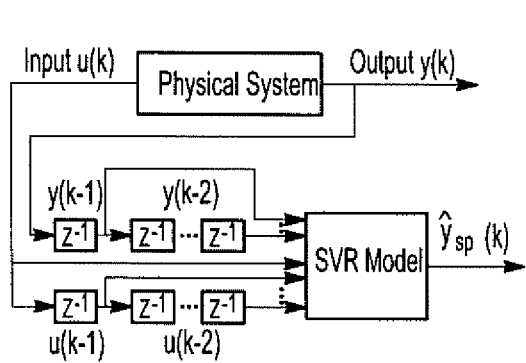
FIG. 1A illustrates the series-parallel model of the prior art.

The present invention and model incorporates delayed SVR series-parallel structure as the submodels and uses a forward path to construct the information needed for output prediction thereby avoiding feedback loops in the parallel model thereby avoiding ill behavior and instability. An alternative approach is to inject the delayed output and the corresponding measurable model error into the parallel model and mitigate the drawbacks of the parallel SVR model without incurring substantial additional computation.

A support vector machine allows modeling of complex dynamic systems. The kernel of the support vector machine may be various types. In examples of the present invention, as pertaining to the present example as applied to a robot arm system and data, the example assumes $y(k-3)$ is available, but the structure is general, and can be applied to cases when $y(k-2)$ or $y(k-5)$ is available rather than $y(k-3)$. The present SVR model is applied to a robot arm system. The modeling using support vector machine is illustrated with a wavelet kernel, which is well suited to modeling nonlinear systems. These kernels are used in connection with several SVR models. Improvement in model accuracy is obtained by (a) using composite kernels (the ARMA2k model) and (b) properly constructing new kernel functions. In particular, the use of "raised cosine wavelet" kernel provides the most desirable results. In the present example, we will consider the following baseline ARMA2k model $$y(k) = \sum_{\beta_i} [(k)_{1i}(v_1, sv_{1i}) + k_{2i}(v_2, sv_{2i}))] \quad (1)$$

where $v_1 = [u(k-1), u(k-2)]$, $v_2 = [y(k-1), y(k-2), y(k-3)]$, are the corresponding moving average (MA) and auto-regression (AR) regressors for the ARMA2k model. $sv_{1i}$, $sv_{2i}$, $i=1, 2\ldots$ are the support vectors obtained from linear programming optimization process. The model can be put in the general format as $$\hat{y}_{ps}(k) = f(u(k-1), u(k-2), y(k-1), y(k-2), y(k-3)) \quad (2)$$

if it is implemented in the series-parallel form or $$\hat{y}_p(k) = f(u(k-1), u(k-2), \hat{y}_p(k-1), \hat{y}_p(k-2), \hat{y}_p(k-3))(2) \quad (3)$$

if it is implemented in the parallel form.

Applications include all types of nonlinear system modeling, and the general approach described has widespread applications including electronic engine control in automobiles, image compression, speech signal processing, process control generally, and other complex examples.

To evaluate the effects of using delayed output in the "hybrid" SVR model three different SVR baseline models are considered. First, rbf kernels. Both the MA and the AR kernels are rbf function of the form:

$$k_{1,2}(x, y) = e^{\frac{-(x-y)(x-y)^1}{2p^2}} \quad \text{for some parameter } p. \quad (4)$$

Second, the tensor wavelet kernels wherein the hybrid spline function is used for the MA kernel and the tensor wavelet is used for the AR kernel $$k_1(x, y) = \exp(local_{kernel}), \quad (5)$$

$$local_{kernel}(x, y) = \exp\left(-\sqrt{\left((x-y) * \frac{(x-y)^1}{2p^2}\right)}\right)$$

$$k_2(x, y) = z_1 z_1 \ldots z_n, z_i = \cos(p_{1i}(x(i) - y(i))) * \exp\left(-\frac{(x(i) - y(i))^2}{2p_{zi}}\right) \quad (6)$$

and third, the raised cosine wavelet kernel wherein the third-order B-spline function is used for the MA kernel and the raised cosine wavelet kernel is used for the AR kernel. The B-spline function has the form $$k_1(x, y) = z_{11} z_{12} \ldots z_{1n}, \quad z_{1i} = B_3(x_i - y_i) \quad (7)$$

$$B_3(\cdot) = \frac{1}{3!} \quad (8)$$

$$\left(\binom{4}{0}(\cdot+2)_+^3 - \binom{4}{1}(\cdot+1)_+^3 + \binom{4}{2}(\cdot)_+^3 - \binom{4}{3}(\cdot-1)_+^3 + \binom{4}{4}(\cdot-2)_+^3\right)$$

and $(z)_+ = \max(z, 0)$. The raised cosine wavelet kernel takes the form of $$k_2(x, y) = z_{21} z_{22} \ldots z_{2n}, \quad = \frac{n_{i1}}{d_{i1}} - \frac{n_{i2}}{d_{i2}} \quad (9)$$

$$n_{i1} = \sin\left(\frac{2\pi(1 - p_1)(x(i) - y(i) - p_2)}{p_3}\right) + \sin\left(\frac{2\pi(1 + p_1)(x(i) - y(i) - p_2)}{p_3}\right)$$

$$n_{i2} = \sin\left(\frac{2\pi(1 - p_1)(x(i) - y(i) - p_2)}{p_3}\right) + \sin\left(\frac{2\pi(1 + p_1)(x(i) - y(i) - p_2)}{p_3}\right)$$

$$d_{i1} = 2\pi\left(\frac{x(i) - y(i) - p_2}{p_3}\right)\left(1 + 4p_1 \frac{x(i) - y(i) - p_2}{p_3}\right)$$

$$d_{i2} = 2\pi\left(\frac{x(i) - y(i) - p_2}{p_3}\right)\left(1 - 2p_1 \frac{x(i) - y(i) - p_2}{p_3}\right)$$

where p's are the kernel parameters that have different interpretation for different kernels.

The results of three various models for the above referenced series-parallel and parallel implementations applied to the robot arm benchmark problem are summarized in Table 1 as the baseline for analysis. The rbf has the simplest model expression, but its parallel implementation has the largest error. The raised cosine wavelet kernel has the best parallel implementation results.

TABLE 1 rms error of the SVR models tested on the robot arm benchmark data set

| SVR Model kernel | Parallel-series | Parallel |
|---|---|---|
| Rbf | 0.1498 | 0.9348 |
| Tensor Wavelet | 0.0965 | 0.5954 |
| Raised Cosine | 0.1423 | 0.5419 |

Example 1

Hybrid Model with a Delayed Output Insertion

Figure 1B:
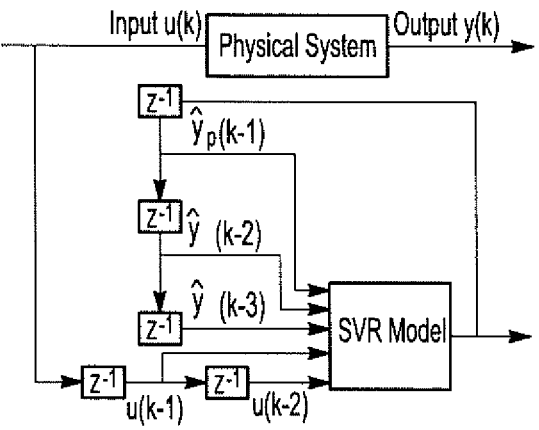
FIG. 1B illustrates a parallel model of the prior art.
Figure 2:
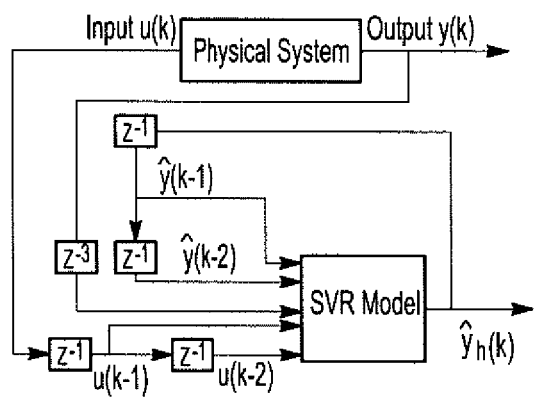
FIG. 2 illustrates a hybrid SVR model.

We will assume y(k) is measured, but is available only after some delay. Therefore, it is assumed that y(k−3) is available for the robot arm problem. Utilizing the series-parallel and parallel models shown in FIGS. 1A and 1B, one straightforward approach is to incorporate the measured output y(k−3) wherever $\hat{y}_p(k-3)$ is needed in the parallel model. This embodiment is shown in FIG. 2. The model in FIG. 2 is the "direct hybrid" SVR model. The direct hybrid SVR model is expressed as $$\hat{y}_h(k) = f(u(k-1), u(k-2), \hat{y}_h(k-1), \hat{y}_h(k-2), y(k-3)) \quad (10)$$

The model above is straightforward and intuitive but is not a viable model and does not improve the parallel model performance. Analytically shown in Table 2 below a physical system can become unstable when it is turned into the model of the direct hybrid as shown in formula (10) above. The numerical case studies are summarized below in Table 2. Data from the various outputs and inputs are compared in order to achieve the most accurate models. Output data from the physical system is compared to output data from the model system.

TABLE 2 rms error of the "direct hybrid" SVR models
tested on the robot arm benchmark data set

| SVR Model kernel | Parallel-series | Parallel | Direct Hybrid |
|---|---|---|---|
| Rbf | 0.1498 | 0.9348 | 2.4503 |
| Tensor Wavelet | 0.0965 | 0.5954 | Unbounded |
| Raised Cosine | 0.1423 | 0.5419 | 1.8316 |

As such, direct insertion of the delayed output does not provide improvement in any of the three SVR baseline models. Accordingly, there exists a need in the art to provide an improved model.

Example 2

Forward Prediction Using Stacked SVR Models

The present embodiment is based on stacking multiple series-parallel models. This model incorporates delayed SVR series-parallel structure as the submodels and uses a forward path to construct the information needed for output prediction, thereby avoiding the feedback loop in the parallel model providing for improved stability and prediction accuracy.

The stacked series-parallel model includes the series-parallel model as a building block. The series-parallel model is illustrated in FIG. 1A. The prediction of y(k) requires y(k−1), y(k−2) and y(k−3), but only y(k−3) is available. Rather than feeding back the model output for y(k−1) and y(k−2), the delayed input and output and the series-parallel model is used to construct the other signals to replace y(k−1) and y(k−2). The proposed stacked model is expressed in the form of $$\hat{y}_s(k)=f(u(k-1),u(k-2),\bar{y}(k-1),\bar{y}(k-2),y(k-3))\quad(4a)$$

$$\bar{y}(k-1)=f(u(k-2),u(k-3),\bar{y}(k-2),y(k-3),y(k-4))\quad(4b)$$

$$\bar{y}(k-2)=f(u(k-3),u(k-4),y(k-3),y(k-4),y(k-5))\quad(4c)\qquad(11)$$

Figure 3:
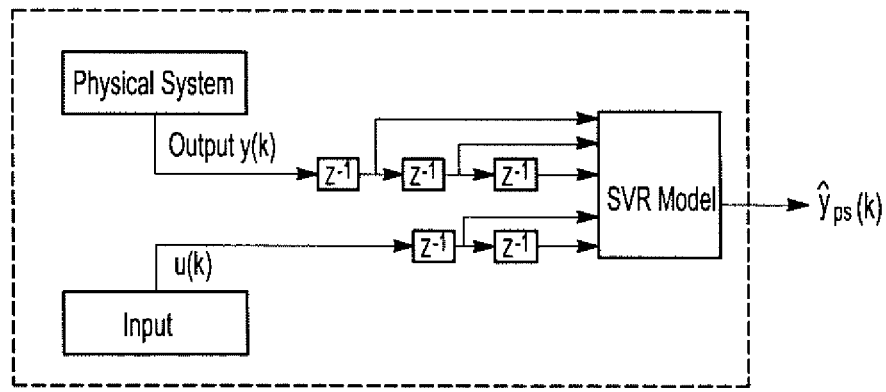
FIG. 3 illustrates a building block portion of the model of the stacked SVR model.
Figure 4:
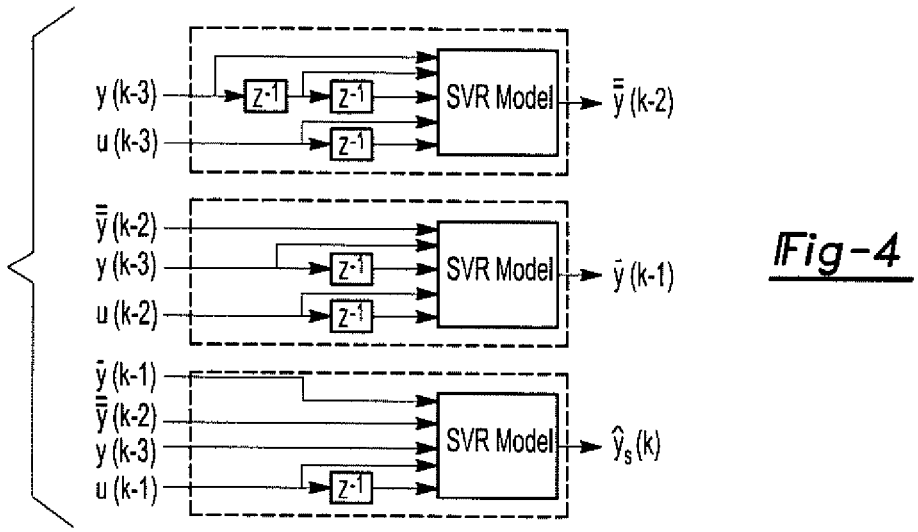
FIG. 4 illustrates the combination of blocks made from the building block as seen in FIG. 3.
Figure 5:
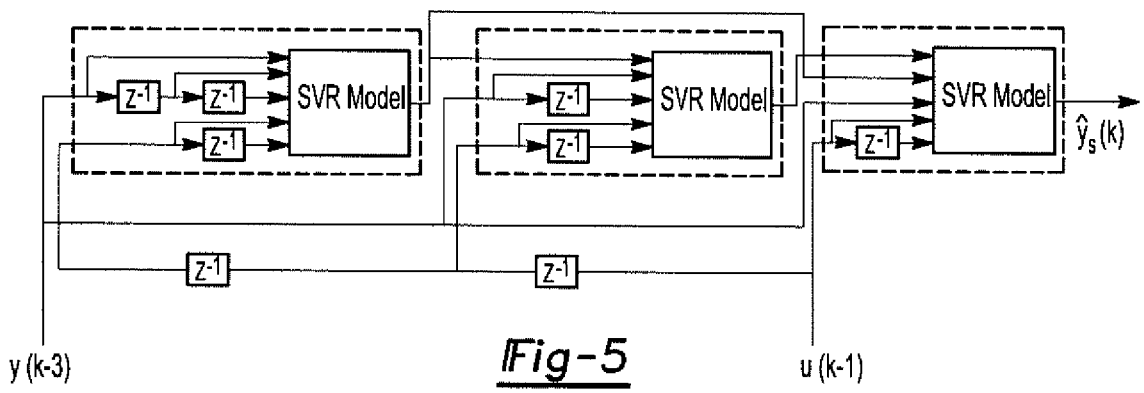
FIG. 5 illustrates a final composite SVR model using $u(k-1)$ and $y(k-3)$ without feedback loops.

The same function f is applied three times in calculating $\hat{y}_s(k)$, but the value of $\hat{y}_s(k)$ is not fed back or reused in generating future prediction. Therefore, all calculations in (11) are in the forward direction and the model (11) does not contain any feedback loop such as in a parallel model. As such, the properties of the stacked SVR model are much like those of the series-parallel model. The model implementation is represented in the flowcharts as seen in FIGS. 3-5. Data from the various outputs and inputs are compared in order to achieve the most accurate models. Output data from the physical system is compared to output data from the model system.

FIG. 3 illustrates the building block of the basic series-parallel model. Input to the physical system u(k) results in an output of y(k). The input u(k) and output y(k) of the physical system as well as their delayed versions are inserted into the SVR model. FIGS. 4 and 5 illustrate the stacking of the building blocks as shown in FIG. 3. FIG. 4 illustrates the blocks made from the building block as seen in FIG. 3 to generate $\bar{y}(k-2)$ and $\bar{y}(k-1)$. FIG. 5 illustrates the final composite SVR model using u(k−1) and y(k−3) without any feedback loops. The performance of the stacked model is evaluated for three different SVR models. The results of this evaluation are shown below in Table 3. All three hybrid models yield excellent accuracy and are a substantial improvement compared to their parallel counterparts. The number of sub models used for the stacked SVR model varies depending on an output delay.

TABLE 3 rms error of the "stacked" SVR models
tested on the robot arm benchmark data set

| SVR Model kernel | Parallel-series | Parallel | Stacked Feedforward Model |
|---|---|---|---|
| Rbf | 0.1498 | 0.9348 | 0.3266 |
| Tensor Wavelet | 0.0965 | 0.5954 | 0.2267 |
| Raised Cosine | 0.1423 | 0.5419 | 0.2931 |

Example 3

Hybrid SVR Model with Error Injection

An alternative embodiment and approach includes the injection of the delayed output y(k−3) and the corresponding measurable modeling error into the parallel model to mitigate the drawbacks of the parallel SVR model while avoids additional computation of the stacked SVR model discussed above.

Figure 6:
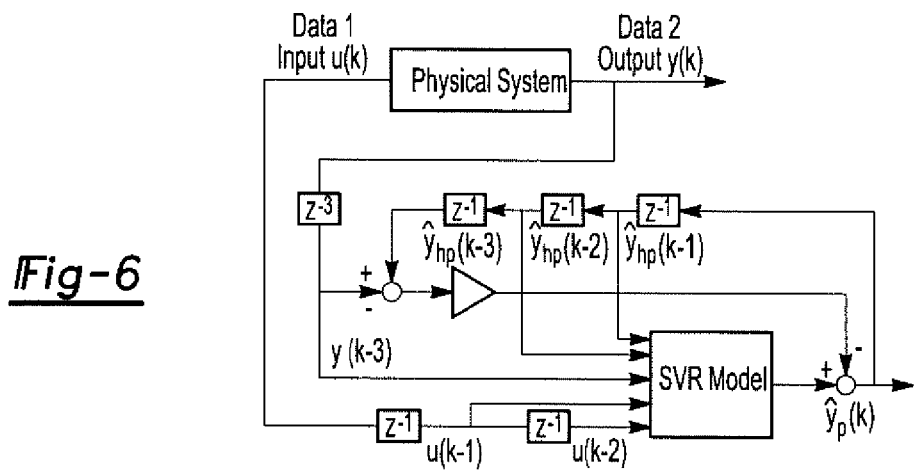
FIG. 6 illustrates a hybrid SVR model with error injection.

Instead of the direct hybrid model as shown and discussed above and in formula (11), a hybrid model is utilized with an error injection in the form of $$\hat{y}_{hp}(k)=f(u(k-1),u(k-2),\hat{y}_{hp}(k-1),\hat{y}_{hp}(k-2),y((k-3))-c^*(\hat{y}_{hp}(k-3)-y(k-3))\qquad(12)$$

where $c^*(\hat{y}_{hp}(k-3)-y(k-3))$ is the extra term that injects the modeling error to the equation to help stabilize the model, and c is the design parameter that can be tuned for desired performance. A graphical and flowchart representation of the present model is illustrated in FIG. 6. Data from the various outputs and inputs are compared in order to achieve the most accurate models. Output data from the physical system is compared to output data from the model system.

FIG. 6 illustrates the parallel SVR model having delayed output measurement and error injection. The result of applying the present hybrid model to the robot arm benchmark data is summarized below in Table 4. When compared to the parallel-series, parallel, and direct hybrid model, the results indicate the performance as shown in Table 4. The value of the c parameter, which is adjusted to achieve the desired modeling accuracy, is shown in the table for various SVR models.

TABLE 4 rms error of the hybrid SVR models with error injection,
tested on the robot arm benchmark data set

| SVR Model kernel | Parallel-series | Parallel | Direct hybrid | Hybrid w/error injection | c-parameter |
|---|---|---|---|---|---|
| Rbf | 0.1498 | 0.9348 | 2.4503 | 0.2213 | 1 |
| Tensor Wavelet | 0.0965 | 0.5954 | Unbounded | 0.1980 | 0.7 |
| Raised Cosine | 0.1423 | 0.5419 | 1.8316 | 0.2107 | 1 |

Figure 7:
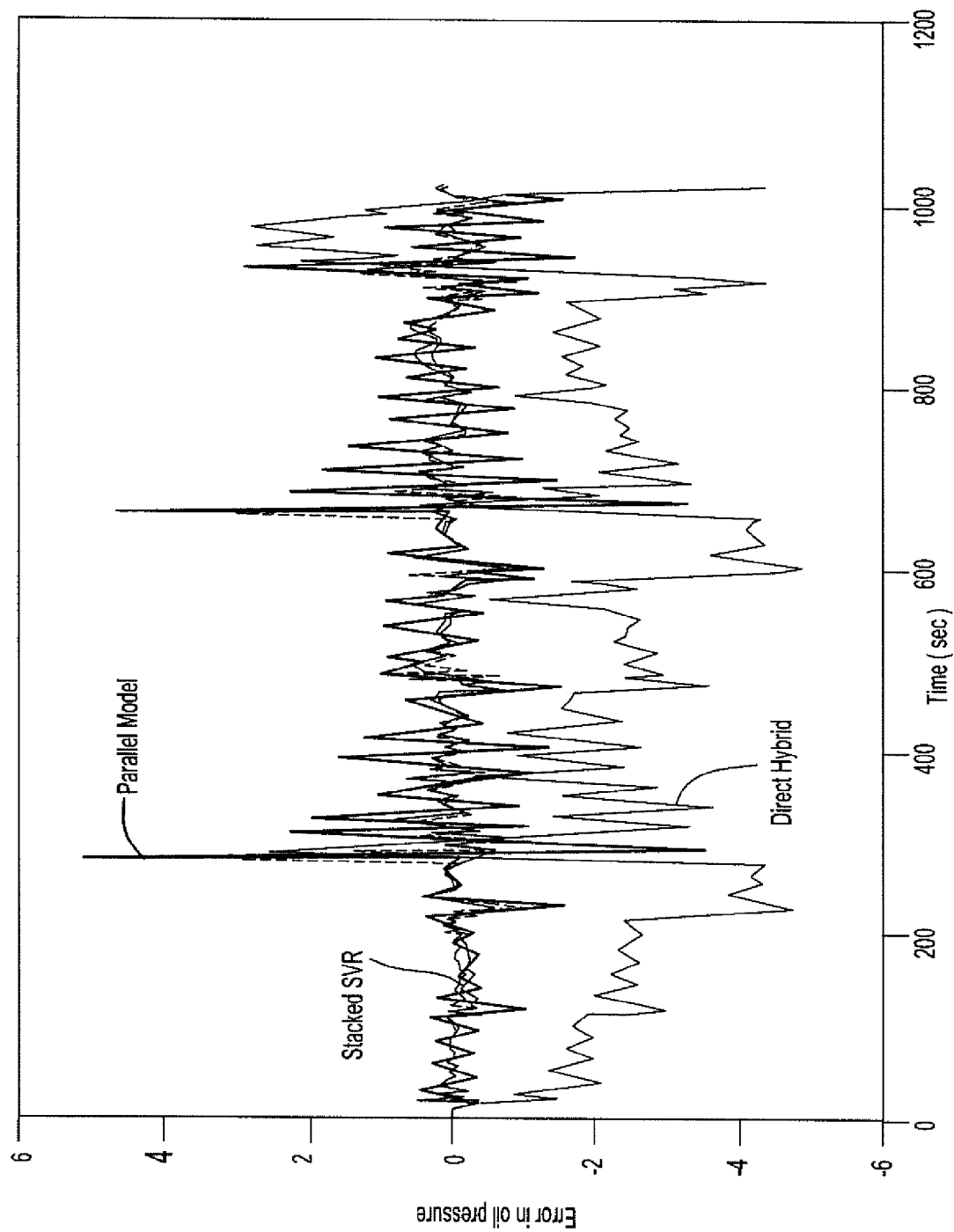
FIG. 7 illustrates a graphical comparison of different "hybrid" models for rbf kernel SVR model.
Figure 8:
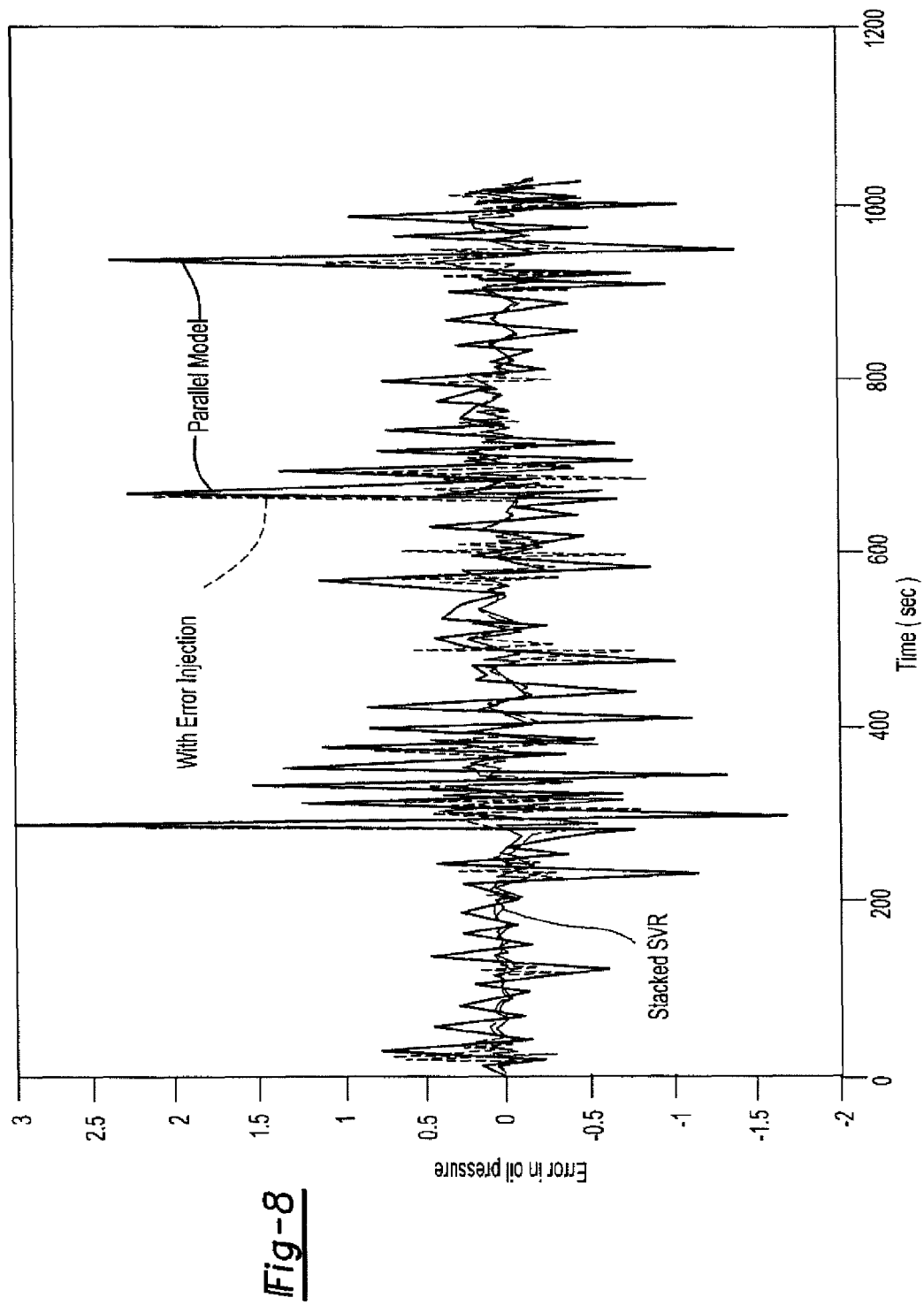
FIG. 8 illustrates a graphical representation and comparison of different "hybrid" models for the tensor wavelet kernel SVR model.
Figure 9:
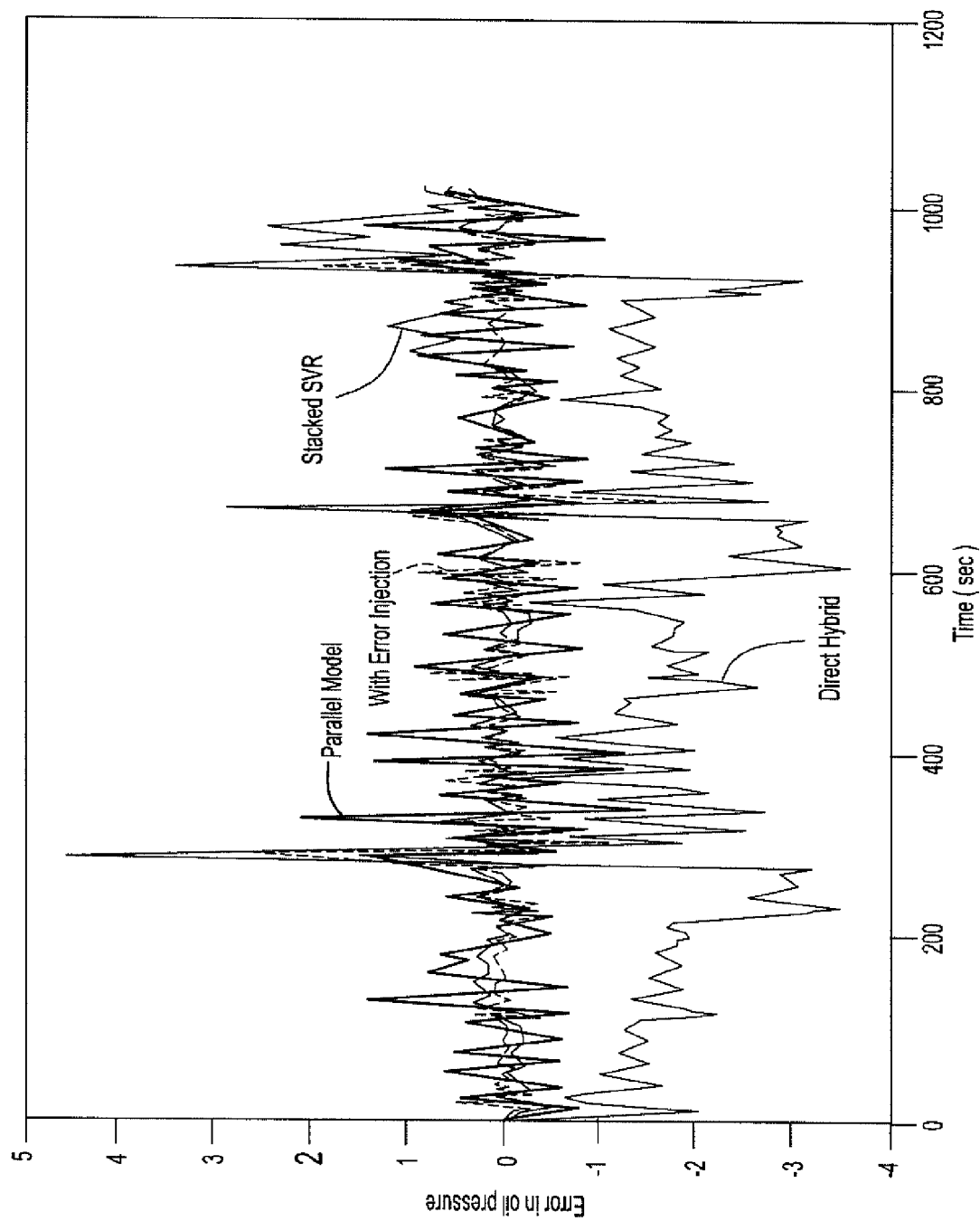
FIG. 9 illustrates a graphical comparison of different "hybrid" models for the raised cosine wavelet kernel SVR model.

FIGS. 7-9 illustrate detailed responses of various model configurations as discussed above. The original SVR models are derived using the first 500 points as training data. The traces given in the plots as shown in FIGS. 7-9 illustrate both the training data and the validation data (the last 520 points) in the results.

Applications of examples of the present invention include modeling of dynamic systems, such as process control, including chemical, physical, and/or mechanical processes control. Further applications include image analysis (such as image cataloging, object recognition such as face detection, and the like), voice recognition, and the computationally demanding other applications. A particular application is engine management and control applications, described further below. Vehicles such as automobiles often include an electronic control unit (ECU) for engine control. The ECU receives engine data from various engine sensors, using the engine data and an engine model to modify the engine operational parameters. Engine sensors providing engine data may include a throttle position sensor, oxygen sensor, manifold absolute pressure sensor, air temperature sensor, coolant temperature sensor, and the like. Engine parameters controlled by an ECU may include fuel injection quantities, ignition timing, variable valve timing, turbocharger boost, and the like. In a typical example, the throttle position sensor provides a throttle position signal as part of the engine data received by the ECU, which in response increases the fuel injection quantities.

Engine operation is enhanced by using by using an ECU that uses an accurate model of engine operation. However, the number of model parameters may become large, so that the computing power necessary to set up and run the model becomes substantial, particularly using conventional approaches. Engine operation is a dynamic process and response to transient data may need to be substantially immediate. Operator inputs are received by the ECU, and result in control of engine operation parameters (such as fuel injection quantity). There also may be adverse safety consequences if an engine model used does not readily allow the ECU to detect or respond quickly to transient data. Hence, dynamic modeling methods using models described herein are particularly useful for engine control applications.

For a new vehicle engine, model parameters may be determined from a various engine testing and model training process using another of the same type of engine. However, these training parameter values may become more inaccurate as the engine wears. Hence, the dynamic model can be adjusted based on a comparison of model predictions and actual observed engine performance. This allows individual optimization of engine performance. The optimized model parameters may further be diagnostic of engine condition.

A support vector machine can be used to model any dynamic process, and is particularly well suited to engine management applications. In examples of the present invention, dynamic system modeling using a support vector machine uses a computationally simple linear programming approach.

Embodiments of the present invention allow improved engine behavior modeling as a function of adjustable engine parameters. An ECU for an engine can use the models discussed above to improve engine performance. Examples include improved engine modeling to allow optimization in exhaust emission reduction, fuel economy enhancement, acceleration, or other engine performance metrics.

Conventional approaches become computationally challenging as the number of engine control inputs increase. Further, conventional modeling approaches such as the use of lookup tables are not adaptive, often use steady-state operation to generate the model, and often cannot properly describe transient behavior of the engine. Conversely, engine modeling according to the present embodiment provides accurate representation of engine performance data. Further, training of an engine model according to the present invention may be much simpler.

Embodiments of the present invention may be used for other types of modeling, in particular modeling of any type of complex multi input, multi output nonlinear systems. Sparsity of the generated model facilitates real-time computation and online model adaptability. Embodiments of the present invention include modeling of transient responses in complex systems. The present invention is not restricted to the illustrative examples and embodiments described above. The examples are not intended as limitations on the scope of the invention. Methods, apparatus, and the like described herein are exemplary and not intended as limitations on the scope of the invention. Changes therein and other uses will occur to those skilled in the art. The scope of the invention is defined by the scope of the appended claims.

Having described our invention, we claim:

1. A method of forward prediction using stacked SVR models for control of an engine, the engine having an Electronic Control Unit (ECU), the method comprising the steps of:

inputting a first set of data u(k) into both a physical system and into an SVR model, the first set of data u(k) received from at least one engine sensor;

collecting a second set of system data y(k) from the physical system;

stacking a plurality of SVR models, the stacked SVR model having the form $\hat{y}_s(k) = f(u(k-1), u(k-2), \bar{y}(k-1), \bar{y}(k-2), y(k-3))$ $\bar{y}(k-1) = f(u(k-2), u(k-3), \bar{y}(k-2), y(k-3), y(k-4))$ $\bar{y}(k-2) = f(u(k-3), u(k-4), y(k-3), y(k-4), y(k-5))$ the resulting stacked SVR model using u(k−1) and y(k−3) without using feedback loops yielding improved accuracy, the ECU configured to modify operation parameters of the engine.

2. The method in accordance with claim 1 further including the step of applying the same function f three times in calculating $\hat{y}_s(k) = f(u(k-1), u(k-2), \bar{y}(k-1), \bar{y}(k-2), y(k-3))$ wherein the value of $\hat{y}_s(k) = f(u(k-1), u(k-2), \bar{y}(k-1), \bar{y}(k-2), y(k-3))$ is not fed back into the stacked SVR model.

3. The method of claim 1 further including the step of comparing data of the physical system to data resulting from the model.

4. A method of hybrid modeling with delayed output measurements for control of an engine, the engine having an Electronic Control Unit (ECU), the method comprising the steps of:

inputting a first set of data u(k) into both a physical system and into an SVR model, the first set of data u(k) received from at least one engine sensor;

collecting a second set of system data y(k) from the physical system;

collecting a third set of system data from the SVR model;

providing the SVR model with both the second set of system data from the physical system and the third set of system data from the SVR model;

injecting a modeling error into both the second set of system data from the physical system and the third set of system data from the SVR model;

modeling the SVR model, the SVR model having the form $\hat{y}_{hp}(k) = f(u(k-1), u(k-2), \hat{y}_{hp}(k-1), \hat{y}_{hp}(k-2), y((k-3)) - c^* (\hat{y}_{hp}(k-3) - y(k-3))$ wherein $-c^*(\hat{y}_{hp}(k-3) - y(k-3))$ is the modeling error thereby leading to an improved model output wherein the physical system is changed based on the SVR model, the ECU configured to modify operation parameters of the engine.

5. The method of claim 4 further including the step of comparing data of the physical system to data resulting from the model.

6. A method of forward prediction of a physical system using stacked SVR models, the physical system having an Electronic Control Unit (ECU), the method comprising the steps of:
- inputting a first set of data u(k) into both a physical system and into an SVR model, the first set of data u(k) received from at least one sensor;
- collecting a second set of system data y(k) from the physical system;
- stacking a plurality of SVR models wherein an output data is fed into the next stacked SVR model;
- collecting the output data from both the physical system and the stacked SVR models, comparing the output data from both the physical system and the stacked SVR models the resulting stacked SVR model using u(k−1) and delayed y(k-d) without using feedback loops yielding improved accuracy, the ECU configured to modify operation parameters of the physical system.

7. The method of claim 6 wherein the number of SVR models used for the stacked SVR model varies depending on an output delay.

8. The method in accordance with claim 6 wherein the stacked SVR model has the form:

$$\hat{y}_s(k)=f(u(k-1),u(k-2),\bar{y}(k-1),\bar{y}(k-2),y(k-3))$$

$$\bar{y}(k-1)=f(u(k-2),u(k-3),\bar{y}(k-2),y(k-3),y(k-4))$$

$$\bar{y}(k-2)=f(u(k-3),u(k-4),y(k-3),y(k-4),y(k-5)).$$

9. The method in accordance with claim 8 further including the step of applying the same function f three times in calculating $\hat{y}_s(k)=f(u(k-1),u(k-2),\bar{y}(k-1),\bar{y}(k-2),y(k-3))$ wherein the value of $\hat{y}_s(k)=f(u(k-1),u(k-2),\bar{y}(k-1),\bar{y}(k-2),y(k-3))$ is not fed back into the stacked SVR model.

* * * * *